(12) United States Patent  
Chen

(10) Patent No.: US 9,147,737 B2  
(45) Date of Patent: Sep. 29, 2015

(54) SEMICONDUCTOR DEVICE AND FABRICATION METHOD

(71) Applicant: Semiconductor Manufacturing International Corp., Shanghai (CN)

(72) Inventor: Aries Chen, Shanghai (CN)

(73) Assignee: SEMICONDUCTOR MANUFACTURING INTERNATIONAL CORP., Shanghai (CN)

(*) Notice: Subject to any disclaimer, the term of this patent is extended or adjusted under 35 U.S.C. 154(b) by 80 days.

(21) Appl. No.: 13/914,868

(22) Filed: Jun. 11, 2013

(65) Prior Publication Data

US 2014/0061870 A1  Mar. 6, 2014

(30) Foreign Application Priority Data

Sep. 3, 2012 (CN) .......................... 2012 1 0321917

(51) Int. Cl.
*H01L 29/40* (2006.01)
*H01L 29/51* (2006.01)
*H01L 21/28* (2006.01)
*H01L 21/8234* (2006.01)
*H01L 21/02* (2006.01)

(52) U.S. Cl.
CPC ............ *H01L 29/401* (2013.01); *H01L 21/022* (2013.01); *H01L 21/0228* (2013.01); *H01L 21/02164* (2013.01); *H01L 21/02178* (2013.01); *H01L 21/02181* (2013.01); *H01L 21/02189* (2013.01); *H01L 21/28194* (2013.01); *H01L 21/823462* (2013.01); *H01L 29/51* (2013.01); *H01L 29/513* (2013.01); *H01L 29/517* (2013.01)

(58) Field of Classification Search
CPC ................. H01L 21/82345; H01L 21/823456; H01L 21/823462; H01L 21/823857; H01L 21/823842; H01L 29/517; H01L 29/401; H01L 21/02164; H01L 21/02178; H01L 21/02181; H01L 21/02189; H01L 21/022; H01L 21/0228; H01L 21/28194; H01L 29/513; H01L 29/51

See application file for complete search history.

(56) References Cited

U.S. PATENT DOCUMENTS

| | | | |
|---|---|---|---|
| 7,192,892 B2 | 3/2007 | Ahn et al. | |
| 2005/0020017 A1* | 1/2005 | Ahn et al. | 438/287 |
| 2005/0123690 A1* | 6/2005 | Derderian et al. | 427/532 |
| 2006/0258078 A1* | 11/2006 | Lee et al. | 438/216 |
| 2006/0270239 A1* | 11/2006 | Triyoso et al. | 438/706 |
| 2008/0124908 A1* | 5/2008 | Forbes et al. | 438/591 |
| 2009/0272965 A1* | 11/2009 | Rachmady et al. | 257/24 |
| 2011/0227163 A1* | 9/2011 | Wang et al. | 257/369 |
| 2013/0089958 A1* | 4/2013 | Yeh et al. | 438/197 |

* cited by examiner

*Primary Examiner* — Jessica Stultz
*Assistant Examiner* — Mohammed R Alam
(74) *Attorney, Agent, or Firm* — Anova Law Group, PLLC

(57) ABSTRACT

Various embodiments provide semiconductor devices including high-K dielectric layer(s) and fabrication methods. An exemplary high-K dielectric layer can be formed by providing a semiconductor substrate including a first region and a second region, and forming a first silicon oxide layer on the semiconductor substrate in the first region. The semiconductor substrate can then be placed in an atomic layer deposition (ALD) chamber to repeatedly perform a selective ALD process. The selective ALD process can include an etching process and/or a purging process in the ALD chamber. By repeatedly performing the selective ALD process, a first high-K dielectric layer can be selectively formed on the first silicon oxide layer in the first region, exposing the semiconductor substrate in the second region.

14 Claims, 6 Drawing Sheets

SEMICONDUCTOR DEVICE AND FABRICATION METHOD

CROSS-REFERENCES TO RELATED APPLICATIONS

This application claims priority to Chinese Patent Application No. CN201210321917.2, filed on Sep. 3, 2012, the entire contents of which are incorporated herein by reference.

FIELD OF THE DISCLOSURE

The present disclosure relates to the field of semiconductor fabrication and, more particularly, relates to semiconductor devices including high-K dielectric layers and methods for forming the same.

BACKGROUND

With continuous development of integrated circuit (IC) manufacturing technology, feature size of metal-oxide-semiconductor (MOS) transistors becomes smaller. As process node shrinks, thickness of gate dielectric layers (e.g., silicon oxide) is continuously reduced. The increased thickness of the gate dielectric layer increases the leakage current of the MOS transistors exponentially. Therefore, using silicon oxide as a gate dielectric layer no longer meets requirements for high-speed IC development. Gate stack structures including a high-K dielectric layer and a metal gate electrode have been introduced into the MOS transistors to replace gate stack structures based on a silicon oxide layer and a polysilicon electrode.

Existing methods for forming a high-K dielectric layer include a physical vapor deposition process (PVD) and a chemical vapor deposition process (CVD). The CVD process includes an atomic layer deposition (ALD) process and a metal organic chemical vapor deposition (MOCVD).

An ALD process for forming a high-K dielectric layer, e.g., a high-K hafnium oxide layer, may include: placing a semiconductor substrate in an ALD chamber; pulsing a first precursor, such as $H_2O$, into the ALD chamber; purging residues of the first precursor and a first reaction product; introducing a second precursor, such as hafnium tetrachloride, into the ALD chamber; and purging residues of the second precursor and a second reaction product. This process is repeatedly performed until a high-K dielectric layer of hafnium oxide forms on the semiconductor substrate.

However, when such existing ALD process is used to form high-K dielectric layers, it is difficult to form high-K dielectric layers with different thicknesses at different regions of a semiconductor substrate, unable to satisfy the requirements for manufacturing semiconductor devices.

BRIEF SUMMARY OF THE DISCLOSURE

According to various embodiments, there is provided a method for selectively forming a high-K dielectric layer by first providing a semiconductor substrate including a first region and a second region. A first silicon oxide layer can be formed on the semiconductor substrate in the first region. The semiconductor substrate can be placed in an atomic layer deposition (ALD) chamber to perform a selective ALD process. In the selective ALD process, a second high-K material layer can be formed in the ALD chamber such that the second high-K material layer is controlled to have a thickness on the first silicon oxide layer greater than a thickness on the semiconductor substrate. An etching gas can then be introduced into the ALD chamber until the second high-K material layer in the second region is removed to form a third high-K material layer selectively on the first silicon oxide layer. The ALD chamber can then be purged. The selective ALD process can be repeatedly performed to form a first high-K dielectric layer selectively on the first silicon oxide layer in the first region and to expose the semiconductor substrate in the second region.

According to various embodiments, there is provided a semiconductor device. The semiconductor device can include a semiconductor substrate including a first region and a second region, a first silicon oxide layer disposed on the semiconductor substrate in the first region, and a first high-K dielectric layer selectively formed on the first silicon oxide layer in the first region and exposing the semiconductor substrate in the second region. The first high-K dielectric layer can be formed by placing the semiconductor substrate in an atomic layer deposition (ALD) chamber to perform one or more selective ALD processes. The selective ALD process can include first forming a second high-K material layer in the ALD chamber such that the second high-K material layer is controlled to have a thickness on the first silicon oxide layer greater than a thickness on the semiconductor substrate. An etching gas can be introduced into the ALD chamber until the second high-K material layer in the second region is removed to form a third high-K material layer selectively on the first silicon oxide layer. This can be followed by purging the ALD chamber.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

FIGS. 1-4 depict a high-K dielectric layer formed on a semiconductor substrate and having a thickness variation in different regions for generating different threshold voltages at the different regions for a transistor.

Figure 1:
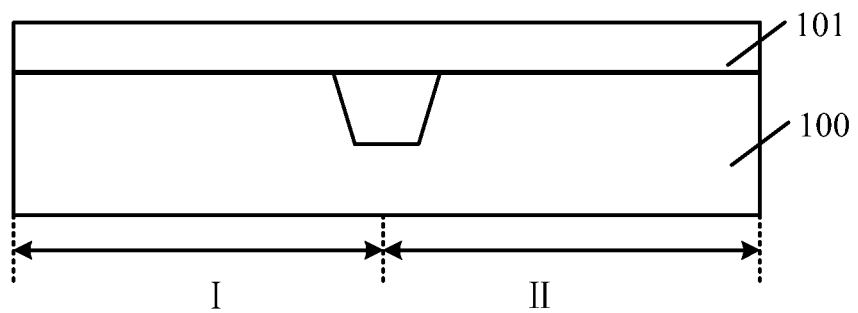
FIGS. 1-4 depict cross-sectional views of a high-K dielectric layer at various stages during its formation.
Figure 2:
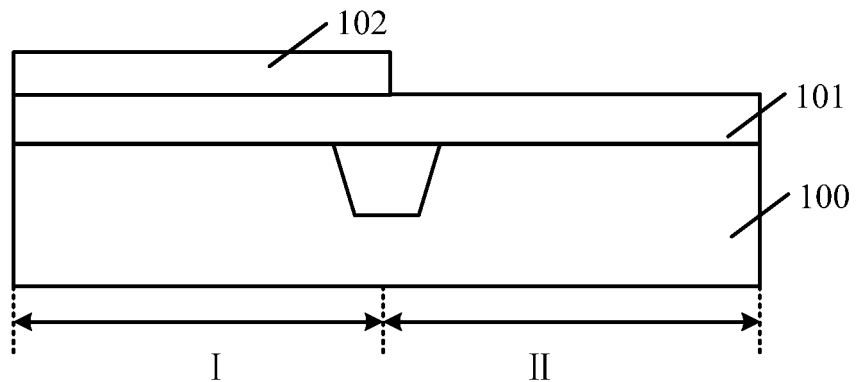
Figure 3:
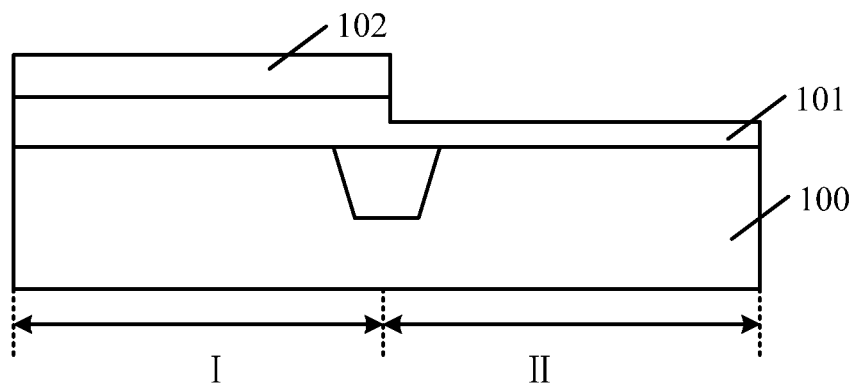

In FIG. 1, a semiconductor substrate 100 is provided, which has a first region I and a second region II. A high-K dielectric layer 101 is formed on the semiconductor substrate 100. In FIG. 2, a photoresist layer 102 is formed on the high-K dielectric layer 101 in the first region I to expose the high-K dielectric layer 101 in the second region II. In FIG. 3, using the photoresist layer 102 as a mask, a portion of the high-K dielectric layer 101 in the second region II is removed by etching. As a result, the high-K dielectric layer 101 in the first region I can have a different thickness from the high-K dielectric layer 101 in the second region II.

Figure 4:
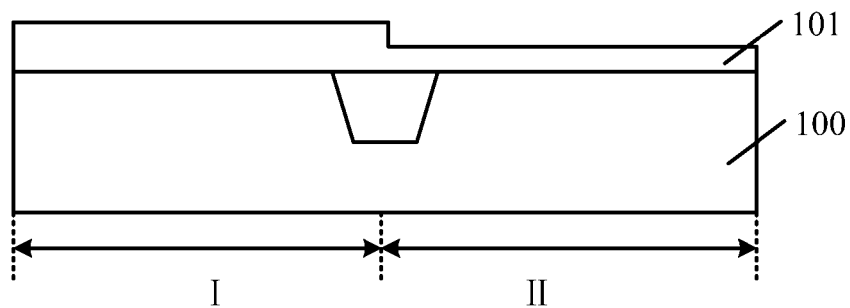

In FIG. 4, the photoresist layer 102 is removed. The removal of the photoresist layer 102, however, may cause etching damage to the surface of the high-K dielectric layer 101 in the first region I and the second region II. In addition, when etching the portion of the high-K dielectric layer 101 in the second region II, it is difficult to control the thickness of the portion to be removed from the high-K dielectric layer 101 in the second region II. This may adversely affects device performance of the subsequently-formed semiconductor device.

Another method for forming a high-K dielectric layer having thickness variations includes using different substrate materials for forming the high-K dielectric layer thereon, without causing etching damages. However, in many cases, the thickness variations achieved on different substrate materials are limited and cannot meet requirements for manufacturing semiconductor devices. For example, an ALD process may be used to form a hafnium oxide high-K dielectric layer on a silicon substrate and a silicon oxide substrate with different thickness. However, such thickness difference is relatively small and, thus, often cannot meet the requirements for manufacturing semiconductor devices.

Figure 5:
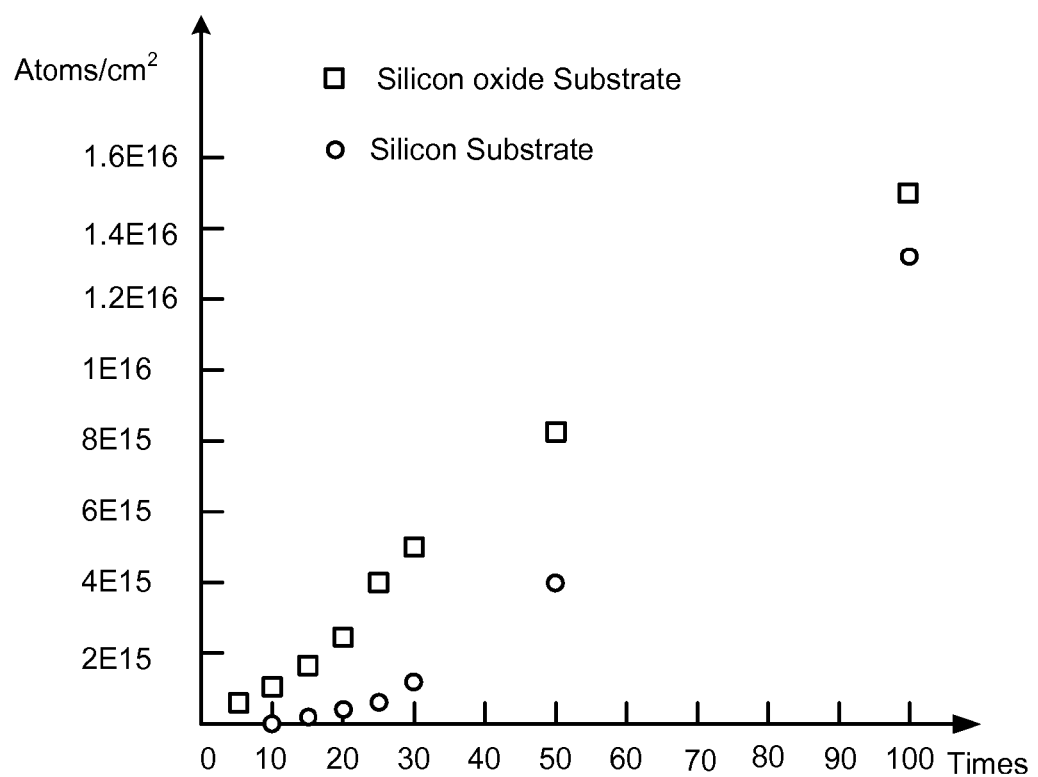
FIG. 5 depicts a relationship between a coverage rate of a hafnium oxide layer formed on a silicon substrate and a silicon oxide substrate and a number of times for repeatedly pulsing a first precursor and a second precursor into an ALD process in accordance with various disclosed embodiments.

FIG. 5 shows a relationship between a coverage rate of a hafnium oxide layer formed on a silicon substrate and a silicon oxide substrate and a number of times for repeatedly pulsing a first precursor and a second precursor into an ALD process. Specifically, the horizontal axis in FIG. 5 indicates the number of times for introducing the first precursor and the second precursor (i.e., repeatedly performing an ALD cycle). The vertical axis in FIG. 5 indicates a coverage rate of the hafnium oxide layer, which may refer to the number of hafnium (Hf) atoms per square centimeter on the substrate.

As shown in FIG. 5, with low number of times for repeatedly performing ALD cycles, the coverage rate of the hafnium oxide layer on the silicon substrate is much lower than the coverage rate of the hafnium oxide layer on the silicon oxide substrate. As the number of times for repeatedly performing the ALD cycles increases, a coverage rate difference between the hafnium oxide layer on the silicon substrate and the hafnium oxide layer on the silicon oxide substrate is gradually reduced. In ALD processes, thickness of the hafnium oxide layer is directly related to the coverage rate of the hafnium oxide layer. For example, the greater the coverage rate of the hafnium oxide layer, the greater the thickness of the hafnium oxide layer can be.

Generally, a hafnium oxide layer formed by one ALD cycle has a thickness of less than about 1 angstrom. To form a hafnium oxide layer having a thickness ranging from about tens of angstroms to about hundreds of angstroms, there are from about tens of ALD cycles to about hundreds of ALD cycles that need to be performed. As a result, the more times for repeatedly performing the ALD cycles, the less of a coverage rate difference between the hafnium oxide layer on the silicon substrate and the hafnium oxide layer on the silicon oxide substrate. This in turn reduces or eliminates thickness variation of the hafnium oxide layer on the silicon substrate and on the silicon oxide substrate. Apparently such thickness variation is unable to meet requirements for semiconductor manufacturing processes.

Figure 6:
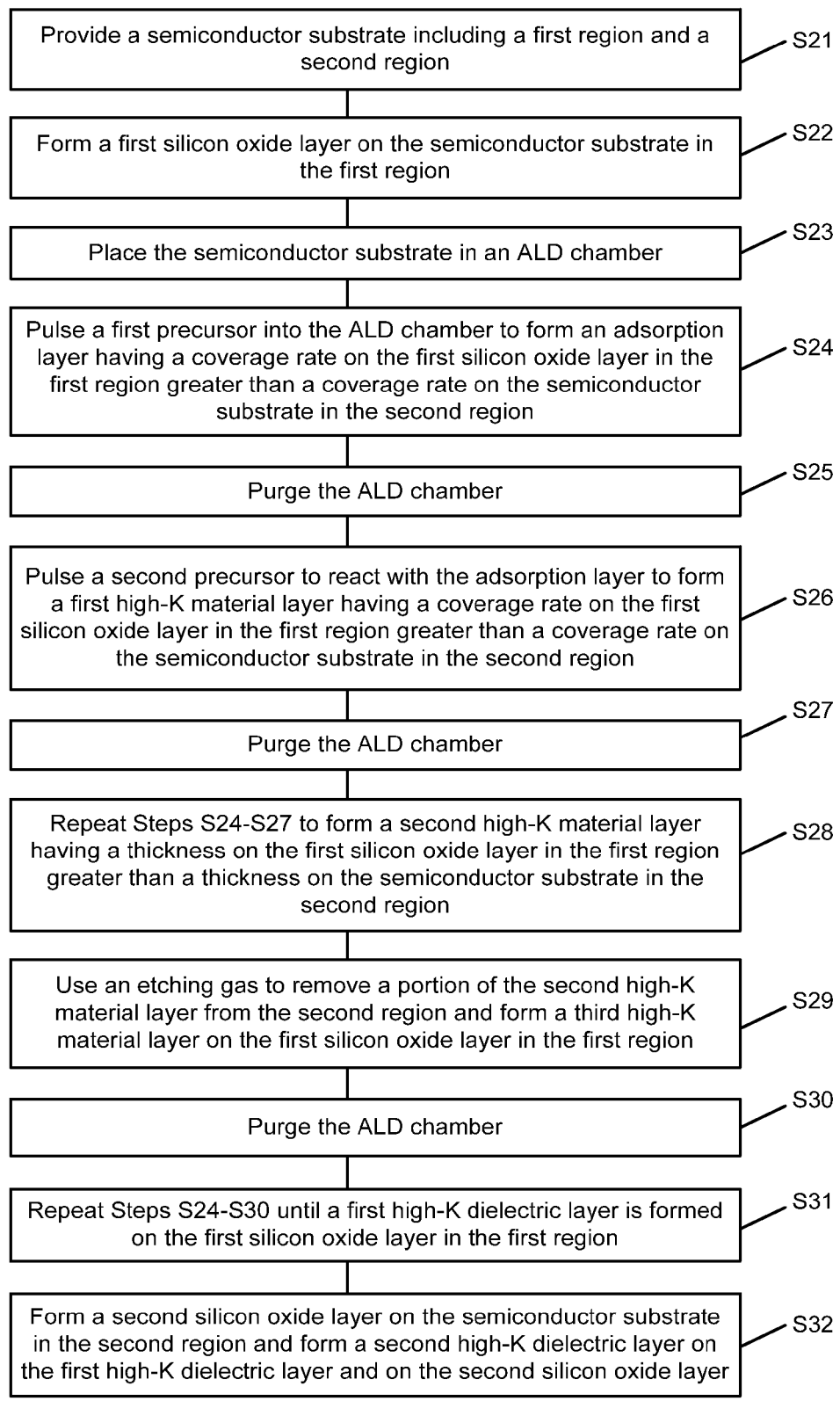
FIG. 6 depicts an exemplary method for selectively forming a high-K dielectric layer in accordance with various disclosed embodiments.

FIG. 6 depicts an exemplary method for selectively forming a high-K dielectric layer, while FIG. 7-14 depict cross-sectional views of a semiconductor device having a high-K dielectric layer at various stages during its formation in accordance with various disclosed embodiments. Note that although FIGS. 7-14 depict semiconductor structures corresponding to the method depicted in FIG. 6, the semiconductor structures and the method are not limited to one another in any manner.

Figure 7:
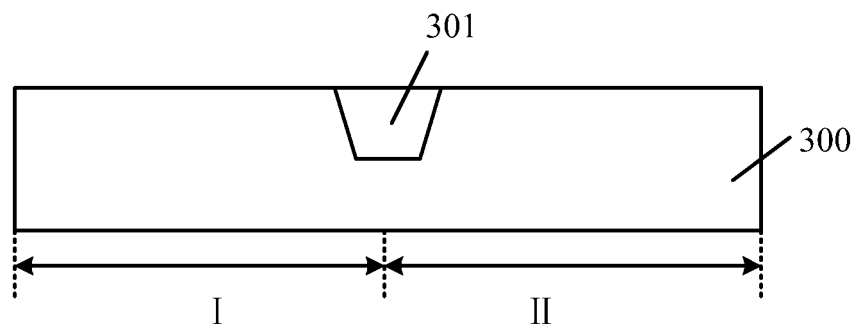
FIGS. 7-14 depict cross-sectional views of an exemplary semiconductor device having a high-K dielectric layer at various stages during its formation in accordance with various disclosed embodiments.

In Step S21 of FIG. 6 and referring to FIG. 7, a semiconductor substrate 300 is provided. The semiconductor substrate 300 can include a first region I and a second region II. An isolation structure such as a shallow trench isolation (STI) structure 301 can be formed within the semiconductor substrate 300. The shallow trench isolation structure 301 can be used to electrically isolate semiconductor devices subsequently-formed in the first region I and the second region II.

In the first region I of the semiconductor substrate 300, when a selective ALD process is used to subsequently form a first high-K dielectric layer on surface of a first silicon oxide layer in the first region I, the high-K dielectric material of the first high-K dielectric layer is not formed on the semiconductor substrate 300 in the second region II.

After the first high-K dielectric layer is selectively formed, a non-selective ALD process can be used to form a second high-K dielectric layer on the first high-K dielectric layer in the first region I and over the semiconductor substrate in the second region II. The thickness of the high-K dielectric layer (e.g., including the first high-K dielectric layer and the second high-K dielectric layer) on the semiconductor substrate 300 in the first region I can be different from the thickness of the high-K dielectric layer (e.g., including the second high-K dielectric layer but without having the first high-K dielectric layer) on the semiconductor substrate 300 in the second region II.

Thickness variation between the high-K dielectric layer in the first region I and the high-K dielectric layer in the second region II can be directly related to the thickness of the first high-K dielectric layer selectively formed on the semiconductor substrate 300 in the first region I. Therefore, the thickness variation between the high-K dielectric layer in the first region I and the high-K dielectric layer in the second region II can be varied over a wide range as desired to meet the requirements for manufacturing semiconductor devices. Further, there can be no etching damage to surfaces of the high-K dielectric layer. Surface uniformity of the high-K dielectric layer can be improved.

In various embodiments, the high-K dielectric layer formed in the first region I can serve as a gate dielectric layer of a first transistor. The high-K dielectric layer formed in the second region II can serve as a gate dielectric layer of a second transistor. The first transistor and the second transistor can have different threshold voltages due to thickness variations of the high-K dielectric layer(s) formed in the first region I and the second region II.

In some embodiments, the high-K dielectric layer formed in the first region I can subsequently serve as, e.g., a storage dielectric of a Resistive Random Access Memory (RRAM). The high-K dielectric layer formed in the second region II can subsequently serve as a gate dielectric layer of a third transistor. The third transistor can serve as a selection transistor or a transistor with other functions.

The semiconductor substrate 300 can be a substrate of silicon, germanium, gallium nitride, glass, silicon-on-insulator, and/or germanium-on-insulator. In one example, the semiconductor substrate 300 can be a silicon substrate.

Figure 8:
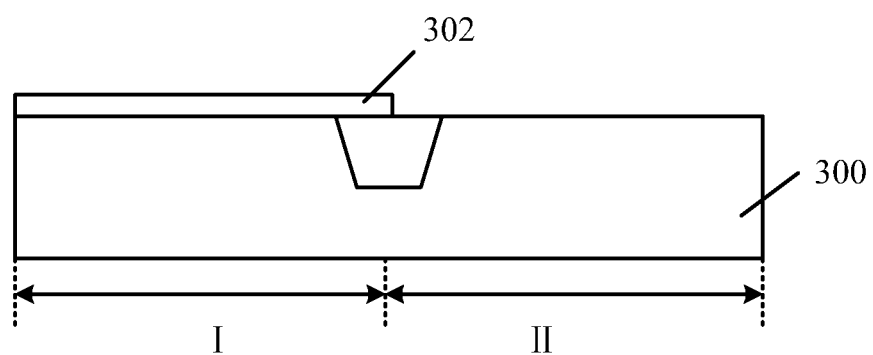

In Step S22 of FIG. 6 and referring to FIG. 8, a first silicon oxide layer 302 is formed on surface of the semiconductor substrate 300 in the first region I. The first silicon oxide layer 302 can be formed by a thermal oxidation process, a chemical vapor deposition process, and/or other suitable processes.

The first silicon oxide layer 302 can be formed by, for example, forming a first silicon oxide film on the semiconductor substrate 300 using a thermal oxidation process; forming a mask layer on surface of the first silicon oxide film to expose a portion of the first silicon oxide film in the second region II; using the mask layer as an etch mask to remove the portion of the first silicon oxide film in the second region II to form the first silicon oxide layer 302 in the first region I; and removing the mask layer.

In various embodiments, surface wettability of a substrate may affect selective deposition of dielectric materials. For example, the hydrophobicity of the first silicon oxide layer 302 can be lower than the hydrophobicity of the silicon substrate. When a first precursor (e.g., $H_2O$) is pulsed into an ALD chamber to form an adsorption layer, the coverage rate of the adsorption layer formed on the first silicon oxide layer 302 in the first region I can be greater than the coverage rate of the adsorption layer formed on the semiconductor substrate 300 in the second region II. Therefore, the surface reactivity of the first silicon oxide layer 302 in the first region I can be greater than the surface reactivity of the semiconductor substrate 300 in the second region II.

Figure 9:
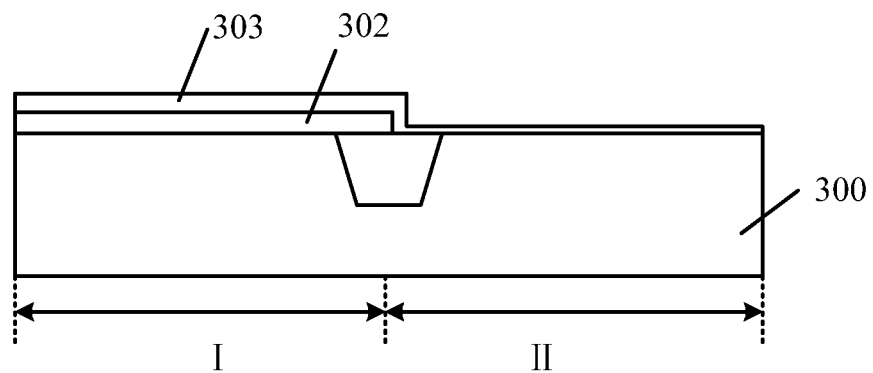

Referring to FIG. 9, a first high-K material layer 303 can be formed on the entire surface of the semiconductor structure shown in FIG. 8. The first high-K material layer 303 can be formed by a first process, for example, as depicted in Steps S23-S27 of FIG. 6.

In Step 23 of FIG. 6, the semiconductor substrate 300 is placed in an ALD chamber. In Step S24, a first precursor is pulsed into the ALD chamber to form an adsorption layer on each surface of the first silicon oxide layer 302 in the first region I and the semiconductor substrate 300 in the second region II. The coverage rate of the adsorption layer in the first region I can be greater than the coverage rate of the adsorption layer in the second region II. In Step S25, residues of the first precursor and a first reaction product are purged from the ALD chamber. An inert gas can be used as a purge gas to purge residues of the first precursor $H_2O$ and the first reaction product in the gas phase from the ALD chamber.

In Step S26, a second precursor is pulsed into the ALD chamber. The second precursor can react with the adsorption layer formed in Step 24 to form a first high-K material layer 303 on the first silicon oxide layer 302 in the first region I and on the semiconductor substrate 300 in the second region II, as shown in FIG. 9. The coverage rate of the first high-K material layer 303 on the surface of the first silicon oxide layer 302 in the first region I can be greater than the coverage rate of the first high-K material layer 303 on the surface of the semiconductor substrate 300 in the second region II. In Step S27, the ALD chamber is purged. For example, residues of the second precursor and a second reaction product can be purged, e.g., by the purge gas, from the ALD chamber.

The first precursor can perform a surface treatment to the first silicon oxide layer 302 in the first region I and the semiconductor substrate 300 in the second region II to form the adsorption layer. The adsorption layer can be a mono-atomic layer. The adsorption layer can provide oxidation groups for a reaction to subsequently form the first high-K material layer.

Because the first silicon oxide layer 302 and the semiconductor substrate 300 can have different surface characteristics under the surface treatment by the first precursor, the coverage rate of the adsorption layer in the first region I can be controlled greater than the coverage rate of the adsorption layer in the second region II. The coverage rate of the adsorption layer can be characterized by the number of atoms of the adsorption layer material per square centimeter (i.e., an atomic coverage: atoms/cm$^2$) on the first silicon oxide layer 302 or on the semiconductor substrate 300. Increasing the coverage rate can increase the surface reactivity of the materials. Therefore, the surface reactivity of the first silicon oxide layer 302 in the first region I can be greater than the surface reactivity of the semiconductor substrate 300 in the second region II.

When the second precursor is subsequently pulsed into the ALD chamber to react with the adsorption layer to form the first high-K material layer 303, the adsorption layer in the first region I can provide more oxidation groups than the adsorption layer in the second region II. So the coverage rate of the first high-K material layer 303 formed on the first silicon oxide layer 302 in the first region I can be greater than the coverage rate of the first high-K material layer 303 formed on the surface of the semiconductor substrate 300 in the second region II. The coverage rate of the first high-K material layer 303 can be characterized by the number of metal atoms of the high-K material per square centimeter (i.e., metal atoms/cm$^2$) on the first silicon oxide layer 302 in the first region I or on the semiconductor substrate 300 in the second region II.

In various embodiments, the first precursor can be water ($H_2O$) or ozone ($O_3$). When the first precursor is water, the water can be supplied into the ALD chamber in a gas phase, e.g., using nitrogen gas as a carrier gas. For example, when the first precursor is water, the adsorption layer can contain hydrogen and oxygen, and can be bonded with the surface of the first silicon oxide layer 302 and the semiconductor substrate 300 in a form of hydrogen-oxygen bond. Because the hydrophobicity of silicon oxide can be lower than the hydrophobicity of silicon, the coverage rate of the adsorption layer on the surface of the first silicon oxide layer 302 in the first region I can be greater than the coverage rate of the adsorption layer on the semiconductor substrate 300 in the second region II. That is, the number of hydroxyl groups per square centimeter (i.e., —OH coverage/cm$^2$) on the surface of the first silicon oxide layer 302 in the first region I can be greater than the number of hydroxyl groups per square centimeter (—OH coverage/cm$^2$) on the semiconductor substrate 300 in the second region II. As a result, the surface reactivity of the first silicon oxide layer 302 in the first region I can be greater than the surface reactivity of the semiconductor substrate 300 in the second region II.

The first precursor can be pulsed into the ALD chamber having a flow rate ranging from about 1 sccm to about 300 sccm with a pulse time ranging from about 0.01 second to about 10 seconds. After the adsorption layer is formed, the inert gas can be pulsed or otherwise introduced into the ALD chamber as the purge gas to purge the residues of the first precursor and the first reaction product out of the ALD chamber. As such, when the second precursor is then pulsed into the ALD chamber, the second precursor can be prevented from directly reacting with the residues of the first precursor.

The purge gas can include, e.g., nitrogen, argon, or a mixture thereof. The purge time of the purge gas can range from about 0.1 second to about 10 seconds. After the residues of the first precursor and the first reaction product are purged from the ALD chamber, the second precursor can be pulsed into the ALD chamber. The second precursor can react with the adsorption layer to form the first high-K material layer 303.

The second precursor can include, e.g., hafnium tetrachloride ($HfCl_4$), zirconium tetrachloride ($ZrCl_4$), trimethyl aluminum (TMA), and/or any other suitable materials. The second precursor can be pulsed into the ALD chamber having a flow rate ranging from about 1 sccm to about 300 sccm with a pulse time ranging from about 0.01 second to about 10 seconds.

In one embodiment, the second precursor can be hafnium tetrachloride (HfCl$_4$). Hafnium tetrachloride (HfCl$_4$) can react with the adsorption layer to form a mono-atomic layer of hafnium oxide (i.e., the first high-K material layer 303). The coverage rate of the adsorption layer on the first silicon oxide layer 302 in the first region I can be greater than the coverage rate of the adsorption layer on the semiconductor substrate 300 in the second region II. Therefore, the coverage rate of the high-K material layer 303 on the surface of the first silicon oxide layer 302 in the first region I can be greater than the coverage rate of the high-K material layer 303 on the semiconductor substrate 300 in the second region II.

The coverage rate of the first high-K material layer 303 can be directly related to the thickness of the subsequently-formed second high-K material layer. The higher the coverage rate of the first high-K material layer 303, the thicker the subsequently-formed second high-K material layer can be. The coverage rate of the first high-K material layer 303 can be characterized by the number of metal atoms of the high-K material per square centimeter (i.e., metal atoms/cm$^2$) on the first silicon oxide layer 302 in the first region I or on the semiconductor substrate 300 in the second region II.

In other embodiments, when the second precursor is zirconium tetrachloride (ZrCl$_4$) or trimethyl aluminum (TMA), the second high-K material layer can be a mono-atomic layer of zirconium oxide or aluminum oxide, respectively.

After the first high-K material layer 303 is formed, the purge gas can be pulsed or otherwise introduced into the ALD chamber to purge the residues of the second precursor and the second reaction product in the gas phase out of the ALD chamber.

Figure 10:
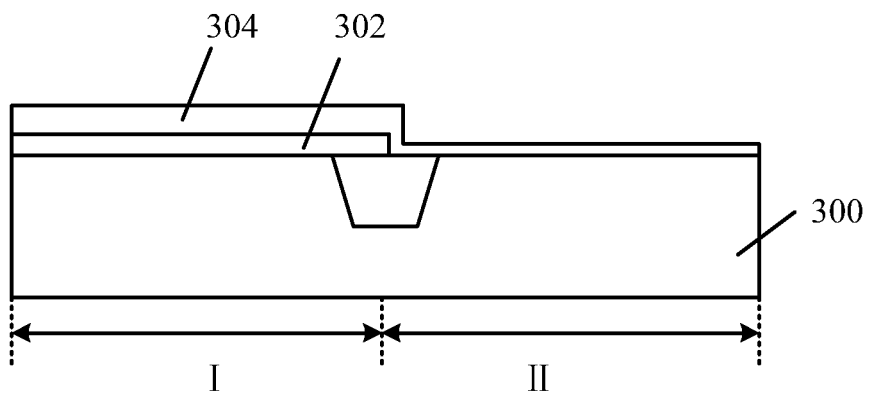

In Step S28 of FIG. 6 and referring to FIG. 10, a second high-K material layer 304 is formed on the first silicon oxide layer 302 in the first region I and on the semiconductor substrate 300 in the second region II. The second high-K material layer 304 can be a multi-layer stacking structure of the mono-atomic layers of the first high-K material layer 303 shown in FIG. 9.

For example, the first process (e.g., an ALD process) as depicted in Steps S24-S27 of FIG. 6, (e.g., by pulsing the first precursor into the ALD chamber; purging the residues of the first precursor and the first reaction product from the ALD chamber; pulsing the second precursor into the ALD chamber; and purging the residues of the second precursor and the second reaction product from the ALD chamber) can be repeatedly performed, until the second high-K material layer 304 is formed on the first silicon oxide layer 302 in the first region I and on the semiconductor substrate 300 in the second region II. In various embodiments, the number of times for repeatedly performing the first process including Steps S24-S27 to form the second high-K material layer 304 can range from about 1 to about 15, or for example, from about 5 to about 10.

Because the coverage rate of the first high-K material layer 303 formed on the first silicon oxide layer 302 in the first region I can be greater than the coverage rate of the first high-K material layer 303 formed on the semiconductor substrate 300 in the second region II, the coverage rate of the second high-K material layer 304 on the surface of the first silicon oxide layer 302 in the first region I can be greater than the coverage rate of the second high-K material layer 304 on the semiconductor substrate 300 in the second region II. That is, the second high-K material layer 304 on the surface of the first silicon oxide layer 302 in the first region I can be thicker than the second high-K material layer 304 on the semiconductor substrate 300 in the second region II.

Depending on the number of times for repeatedly performing the ALD process as depicted in Steps S24-S27 of FIG. 6, the coverage rate of the second high-K material layer 304 on the surface of the first silicon oxide layer 302 in the first region I can be controlled much greater than the coverage rate of the second high-K material layer 304 on the semiconductor substrate 300 in the second region II. In addition, the coverage rate of the second high-K material layer 304 on the semiconductor substrate 300 in the second region II can be sufficiently low or sometimes approach to about zero.

Referring back to FIG. 5, when the number of times for repeatedly performing an ALD cycle is less than about 20, the coverage rate of hafnium oxide formed on the silicon oxide substrate can be much greater than the coverage rate of hafnium oxide formed on the silicon substrate. In addition, the coverage rate of hafnium oxide on silicon substrate can be very low or even sometimes approach to about zero. As disclosed herein, the coverage rate (or thickness) of the second high-K material layer 304 formed on the surface of the first silicon oxide layer 302 in the first region I can be controlled much greater than the coverage rate (or thickness) of the second high-K material layer 304 on the semiconductor substrate 300 in the second region II.

Due to the lower thickness of the second high-K material layer 304 on the semiconductor substrate 300 in the second region II, the second high-K material layer 304 on the semiconductor substrate 300 in the second region II can be easily removed, e.g., by an etching gas, while a corresponding thickness portion can also be removed from the second high-K material layer 304 formed on the surface of the first silicon oxide layer 302 in the first region I. A high-K dielectric layer can then be selectively formed on the first silicon oxide layer 302 in the first region I by the disclosed selective ALD process.

Figure 11:
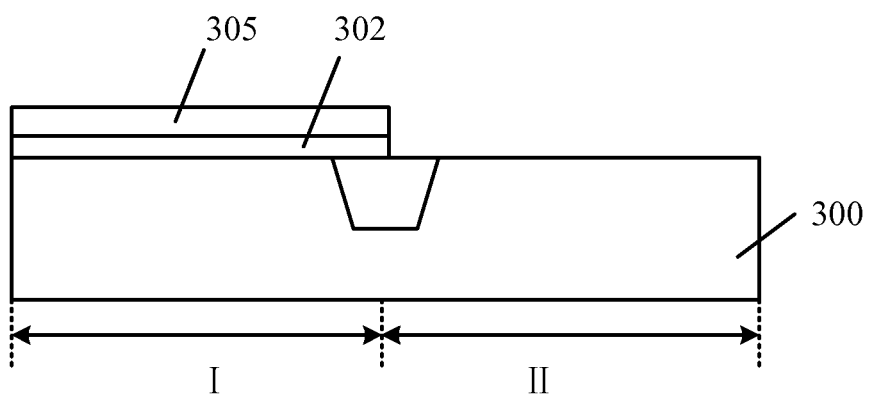

In FIG. 11, a high-K dielectric layer 305 are selectively formed on the first silicon oxide layer 302 in the first region I with the surface of the semiconductor substrate 300 in the second region II exposed. For example, an etching and purging process, as depicted in Steps S29-S30 in FIG. 6, can be performed to selectively form the high-K dielectric layer 305.

In Step S29, an etching gas is introduced into the ALD chamber to remove the second high-K material layer 304 from the semiconductor substrate 300 in the second region II, leaving the third high-K material layer 305 formed on the surface of the first silicon oxide layer 302 in the first region I. In Step S30, residues of the etching gas and a third reaction product (e.g., from the reaction between the etching gas and the second high-K material layer) are purged from the ALD chamber by, e.g., an inert gas.

When the etching gas, such as HF vapor, is introduced (e.g., pulsed) into the ALD chamber to remove the second high-K material layer 304 from the semiconductor substrate 300 in the second region II, a thickness portion of the second high-K material layer 304 on the surface of the first silicon oxide layer 302 in the first region I can also be removed. After etching, the second high-K material layer 304 remaining on the surface of the first silicon oxide layer 302 in the first region I can become the third high-K material layer 305.

As the coverage rate of the second high-K material layer 304 on the surface of the first silicon oxide layer 302 in the first region I can be much greater than the coverage rate of the second high-K material layer 304 on the semiconductor substrate 300 in the second region II, even when the second high-K material layer 304 on the semiconductor substrate 300 in the second region II is completely removed, the removed thickness portion of the second high-K material layer 304 on the first silicon oxide layer 302 in the first region I can be a small fraction compared with an entire thickness of the second high-K material layer 304 in the first region I before the removal of the second high-K material layer 304 from the second region II.

When the second high-K material layer 304 on the semiconductor substrate 300 in the second region II is removed, e.g., using the HF-containing etching gas, there can be no damage to the surface of the semiconductor substrate 300. The etching gas can have a flow rate ranging from about 1 sccm to about 300 sccm for an etching time ranging from about 0.01 second to about 10 seconds. When the second high-K material layer 304 on the semiconductor substrate 300 in the second region II is completely removed, there can be no excessive etching to the second high-K material layer 304 on the surface of the first silicon oxide layer 302 in the first region I. The third high-K material layer 305 can thus be formed.

In this manner, the disclosed selective ALD process can include, e.g., steps for forming the second high-K material layer 304 as shown in FIG. 10, etching the second high-K material layer 304 to form the third high-K material layer 305 as shown in FIG. 11; and purging the ALD chamber to remove residues of the etching gas and the third reaction product from the chamber. In one example, one selective ALD process can include Steps S24-S30 as depicted in FIG. 6.

In some cases, the thickness of the second high-K material layer 304 (and/or the third high-K material layer 305) can range from a few angstroms to tens of angstroms. When higher thicknesses are required according to process requirements for forming the second and/or the third high-K material layers, the disclosed selective ALD process can be repeatedly performed to form a high-K dielectric layer on the silicon oxide layer 302 in the first region I.

Figure 12:
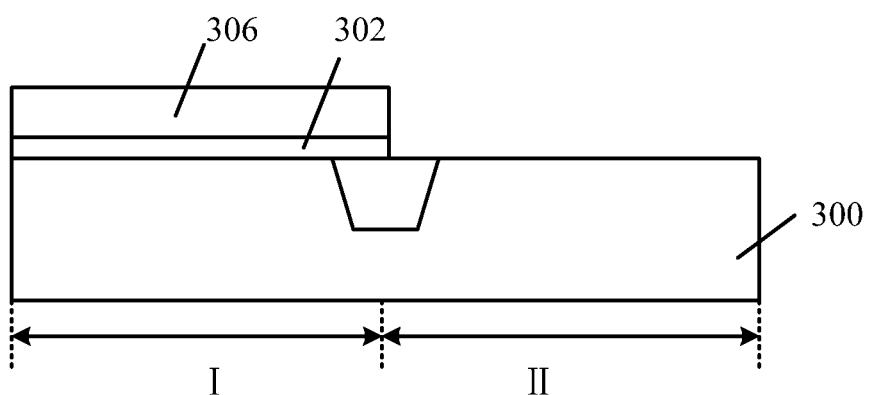

For example, in Step S31 of FIG. 6 and referring to FIG. 12, the selective ALD process (e.g., including Steps S24-S30 in FIG. 6) can be repeatedly performed, until a first high-K dielectric layer 306 is selectively formed on the surface of the first silicon oxide layer 302 in the first region I. The number of times for repeatedly performing the selective ALD process (e.g., Steps including S24-S30 in FIG. 6) can range from about 20 to about 3000 in order to selectively form the first high-K dielectric layer 306 with a target thickness. In one example, the number of times for repeatedly performing the selective ALD process can range from about 50 to about 1000.

In various embodiments, the ALD chamber can be configured to have a pressure ranging from about 0.1 Torr to about 50 Torr at a temperature ranging from about 100° C. to about 500° C. in the ALD chamber.

As such, the first high-K dielectric layer 306 can be selectively formed on the surface of the first silicon oxide layer 302 in the first region I by the selective ALD process with no high-K dielectric layer formed on the semiconductor substrate 300 in the second region II.

When a second high-K dielectric layer is subsequently formed on the first high-K dielectric layer 306 in the first region I and on the semiconductor substrate 300 in the second region II, the thickness of the high-K dielectric layer (which includes the first high-K dielectric layer and the second high-K dielectric layer) in the first region I can be greater than the thickness of the high-K dielectric layer (which includes the second high-K dielectric layer and does not include the first high-K dielectric layer) in the second region II. That is, the thickness variation between the high-K dielectric layer in the first region I and the high-K dielectric layer in the second region II can be determined by the thickness of the first high-K dielectric layer 306 formed by the disclosed selective ALD process. The thickness of the first high-K dielectric layer 306 can be controlled by the number of times for repeatedly performing the selective ALD process, and can thus be controlled over a wide range. This provides a wide spectrum of diverse needs for the fabrication processes.

Figure 13:
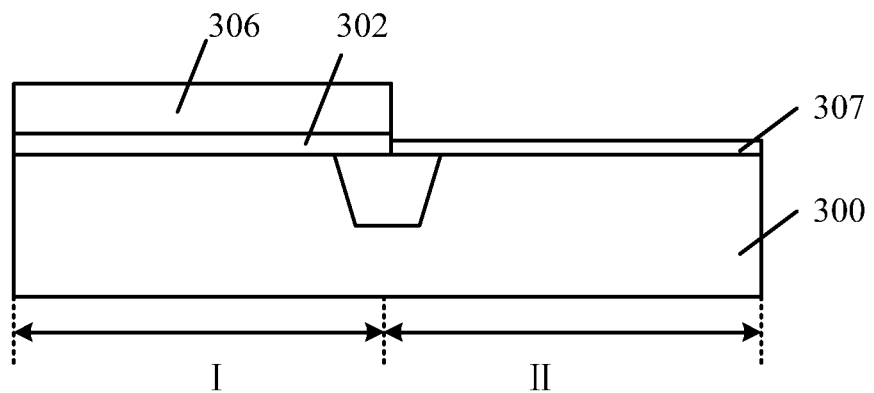

In Step S32 of FIG. 6 and referring to FIG. 13, a second silicon oxide layer 307 is optionally formed on the semiconductor substrate 300 in the second region II. The second silicon dioxide layer 307 can be formed by, e.g., a thermal oxidation process, or other suitable processes. The thickness of the second silicon oxide layer 307 can be the same or different from the thickness of the first silicon oxide layer 302.

Figure 14:
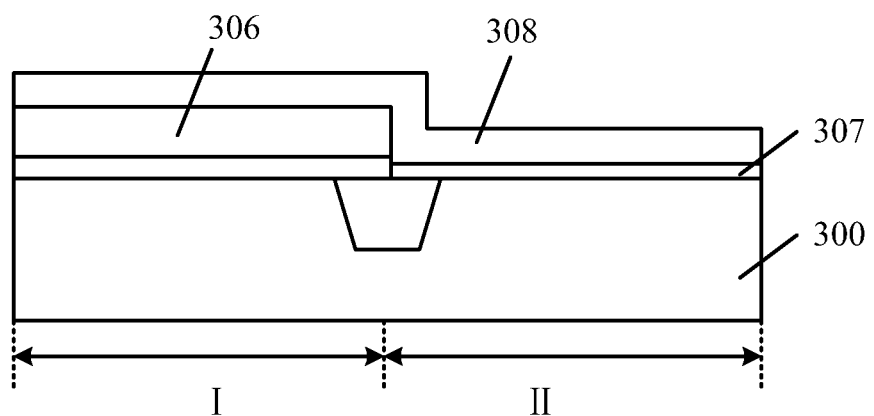

Still in Step S32 of FIG. 6 and referring to FIG. 14, a second high-K dielectric layer 308 is formed by an ALD process (e.g., a non-selective ALD process) on surface of the first high-K dielectric layer 306 and on surface of the second silicon oxide layer 307. Any suitable ALD processes can be used to form the second silicon oxide layer 307. In one example, no etching process (or etching gas) is involved in forming the second silicon oxide layer 307, which is different from the disclosed selective ALD process. The second high-K dielectric layer 308 can be formed of a same material as for the first high-K dielectric layer 306. For example, the second high-K dielectric layer 308 can be formed of hafnium oxide.

As disclosed herein, by using the selective ALD process, when the first high-K dielectric layer 306 is selectively formed on the surface of the first silicon oxide layer 302 in the first region I, no high-K material can be formed on the semiconductor substrate 300 in the second region II.

When the second high-K dielectric layer 308 is subsequently formed on the first high-K dielectric layer 306 in the first region I and on the semiconductor substrate 300 in the second region II, the thickness of the high-K dielectric layer in the first region I (including the first high K dielectric layer 306 and the second high-K dielectric layer 308) can be greater than the thickness of the high-K dielectric layer in the second region II (merely including the second high-K dielectric layer 308). That is, the thickness variation between the high-K dielectric layer in the first region I and the high-K dielectric layer in the second region II can be determined by the thickness of the first high-K dielectric layer 306. The thickness of the first high-K dielectric layer 306 can be controlled by the number of times for repeatedly performing the disclosed selective ALD process, and can thus be controlled over a wide range.

In an exemplary method for selectively forming a high-K dielectric layer, a first silicon oxide layer can be formed on a semiconductor substrate in the first region. The semiconductor substrate can be placed in an ALD chamber. Steps of pulsing a first precursor and pulsing a second precursor can be repeatedly performed in the ALD chamber. Because of the different properties of silicon oxide material and silicon material, the thickness of a second high-K material layer formed on the surface of the first silicon oxide layer in the first region can be greater than the thickness of the second high-K material layer formed on the semiconductor substrate in the second region.

An etching gas can be introduced into the ALD chamber after forming the second high-K material layer to remove a portion of the second high-K material layer from the semiconductor substrate in the second region. The etching step can only remove a small thickness portion of the second high-K material layer on the first silicon oxide layer in the first region, leaving a high-K dielectric layer selectively formed on the first silicon oxide layer in the first region. A selective ALD process can thus be achieved.

Further, the number of times for repeatedly pulsing the first precursor, purging the residues of the first precursor and the first reaction product, pulsing the second precursor, and purging the residues of the second precursor and the second reaction product (e.g., to form a first high-K material layer) can range from about 1 to about 15 to form a second high-K material layer. The coverage rate of the second high-K material layer on the surface of the first silicon oxide layer in the first region can be controlled much greater than the coverage rate of the second high-K material layer on the semiconductor substrate in the second region. For example, the coverage rate of the second high-K material layer on the semiconductor substrate in the second region can be sufficiently low or sometimes approach to about zero.

Therefore, when the etching gas is subsequently introduced or pulsed into the ALD chamber, the second high-K material layer formed on the semiconductor substrate in the second region II can be easily removed with a small thickness portion of the second high-K material layer formed on the surface of the first silicon oxide layer in the first region removed simultaneously. When the second high-K material layer on the semiconductor substrate in the second region is removed using an etching gas, e.g., an HF-containing gas, no damage can occur to the surface of the semiconductor substrate.

The etching gas can have a flow rate ranging from about 1 sccm to about 300 sccm for an etching time ranging from about 0.01 second to about 10 seconds. When the second high-K material layer on the semiconductor substrate in the second region is completely removed, no excessive etching can occur to the second high-K material layer on the surface of the first silicon oxide layer in the first region. High-K dielectric layer(s) can then be selectively formed in the first region.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for selectively forming a high-K dielectric layer, comprising:
   providing a semiconductor substrate including a first region and a second region;
   forming a first silicon oxide layer on the semiconductor substrate in the first region;
   placing the semiconductor substrate in an atomic layer deposition (ALD) chamber to form a first high-K material layer by a first process, the first process including pulsing a first precursor into the ALD chamber, purging the ALD chamber, pulsing a second precursor, and purging the ALD chamber,
      wherein the first high-K material layer is formed by pulsing the first precursor to form an adsorption layer on the first silicon oxide layer in the first region and on the semiconductor substrate in the second region, and by pulsing the second precursor to react with the adsorption layer, and
      wherein a coverage rate of the first high-K material layer on the first silicon oxide layer in the first region is greater than a coverage rate of the first high-K material layer on the semiconductor substrate in the second region;
   performing a selective ALD process, the selective ALD process including:
      forming a second high-K material layer by repeatedly performing the first process based on the first high-K material layer in the ALD chamber such that the second high-K material layer is controlled to have a thickness on the first silicon oxide layer greater than a thickness on the semiconductor substrate;
      introducing an etching gas into the ALD chamber to remove the second high-K material layer in the second region to form a third high-K material layer by a remaining second high-K material layer selectively on the first silicon oxide layer; and
      purging the ALD chamber; and
   repeatedly performing the selective ALD process to form a first high-K dielectric layer selectively on the first silicon oxide layer in the first region and to expose the semiconductor substrate in the second region.

2. The method of claim 1, wherein the purging, after the etching gas is introduced into the ALD chamber, includes purging residues of the etching gas and a third reaction product reacted between the etching gas and the second high-K material layer.

3. The method of claim 1, wherein the introducing of the etching gas into the ALD chamber removes a thickness portion of the second high-K material layer on the first silicon oxide layer in the first region to form a third high-K material layer.

4. The method of claim 1, wherein the first precursor is water or ozone and the first precursor is pulsed having a flow rate ranging from about 1 sccm to about 300 sccm with a pulse time ranging from about 0.01 second to about 10 seconds.

5. The method of claim 1, wherein the second precursor is hafnium tetrachloride, zirconium tetrachloride, trimethyl aluminum, or a combination thereof; and the second precursor is pulsed having a flow rate ranging from about 1 sccm to about 300 sccm with a pulse time ranging from about 0.01 second to about 10 seconds.

6. The method of claim 1, wherein the first high-K dielectric layer is made of a material including hafnium oxide, zirconium oxide, aluminum oxide, or a combination thereof.

7. The method of claim 1, wherein the etching gas includes HF and the etching gas has a flow rate ranging from about 1 sccm to about 300 sccm and an etching time ranging from about 0.01 second to about 10 seconds.

8. The method of claim 1, wherein a number of times for repeatedly performing the first process to form the second high-K material layer ranges from about 1 to about 15.

9. The method of claim 1, wherein a number of times for repeatedly performing the first process to form the second high-K material layer ranges from about 5 to about 10.

10. The method of claim 1, wherein a number of times for repeatedly performing the selective ALD process to form the first high-K dielectric layer ranges from about 20 to about 3000.

11. The method of claim 1, wherein each purging of the ALD chamber in the selective ALD process includes using a purge gas including an inert gas to purge the ALD chamber.

12. The method of claim 11, wherein the inert gas includes nitrogen, argon, or a mixture thereof, and wherein a purge time of the inert gas ranges from about 0.1 second to about 10 seconds.

13. The method of claim 1, further including:
   forming a second silicon oxide layer on the exposed semiconductor substrate in the second region; and
   forming a second high-K dielectric layer on the first high-K dielectric layer and on the second silicon oxide layer.

14. The method of claim 13, wherein the second high-K dielectric layer is formed by an ALD process.

* * * * *